(12) United States Patent
Hsu (10) Patent No.: US 6,596,560 B1
(45) Date of Patent: Jul. 22, 2003

(54) METHOD OF MAKING WAFER LEVEL PACKAGING AND CHIP STRUCTURE

(75) Inventor: Chi-Hsing Hsu, Taipei Hsien (TW)

(73) Assignee: VIA Technologies, Inc., Taipei Hsien (TW)

( * ) Notice: Subject to any disclaimer, the term of this patent is extended or adjusted under 35 U.S.C. 154(b) by 0 days.

(21) Appl. No.: 10/063,572

(22) Filed: May 3, 2002

(30) Foreign Application Priority Data

Dec. 28, 2001 (TW) .................................. 90132737 A (51) Int. Cl.$^7$ .............................................. H01L 21/44

(52) U.S. Cl. .................. 438/108; 438/113; 438/119; 438/458; 438/460; 438/613; 438/622

(58) Field of Search ................. 438/108, 113, 438/119, 458, 460, 613, 622

(56) References Cited

U.S. PATENT DOCUMENTS

| 6,165,885 A | * | 12/2000 | Gaynes et al. | ............... 438/612 |
| 6,245,594 B1 | * | 6/2001 | Wu et al. | ................... 438/108 |
| 6,426,241 B1 | * | 7/2002 | Cordes et al. | ............... 438/108 |

* cited by examiner

*Primary Examiner*—Lynne A. Gurley
(74) *Attorney, Agent, or Firm*—Jiang Chyun IP Office (57) ABSTRACT

FILE: 8289USF.RTF19A chip structure comprises a wafer, an insulation layer, some conductive paste, a plurality of ball pads, a solder mask and a plurality of solder balls. The wafer has an active surface. The insulation layer is formed over the active surface of the wafer. The insulation layer has a plurality of open windows. The conductive paste fills the open windows. The ball pads are formed over the insulation layer in electrical connection with the conductive paste. The solder mask formed over the insulation layer. The solder mask exposes the ball pads. A solder ball is mounted to each ball pad.

16 Claims, 7 Drawing Sheets

METHOD OF MAKING WAFER LEVEL PACKAGING AND CHIP STRUCTURE

CROSS REFERENCE TO RELATED APPLICATIONS

This application claims the priority benefit of Taiwan application serial no. 90132737, filed Dec. 28, 2001.

BACKGROUND OF INVENTION

1. Field of Invention

The present invention relates to a wafer level package. More particularly, the present invention relates to a wafer level package capable of removing the effects due to a difference in thermal expansion coefficient between a chip and corresponding circuit board within the wafer level package.

2. Description of Related Art

In this information proliferation age, the electronic equipment has become an indispensable tool in our daily life. Integrated circuit devices are incorporated into many types of products for commercial, educational, recreational and other uses. Following the rapid advance in electronic manufacturing technologies and the integration of powerful functions, all kinds of personalized products have been developed. In general, the development of miniaturized electronic products is the major trend. Thus, in the semiconductor industry, the trend is also towards the production of high-density packages. To produce high-density packages, chip scale package techniques are often employed. With such techniques, the ultimate size of a package differs not too much from the size of the enclosed chip. There are several production methods for forming a chip scale package, in which the most common method is the so-called wafer level packaging. As the name implies, the chip is fully packaged when the wafer is diced up into separate chips.

Figure 1:
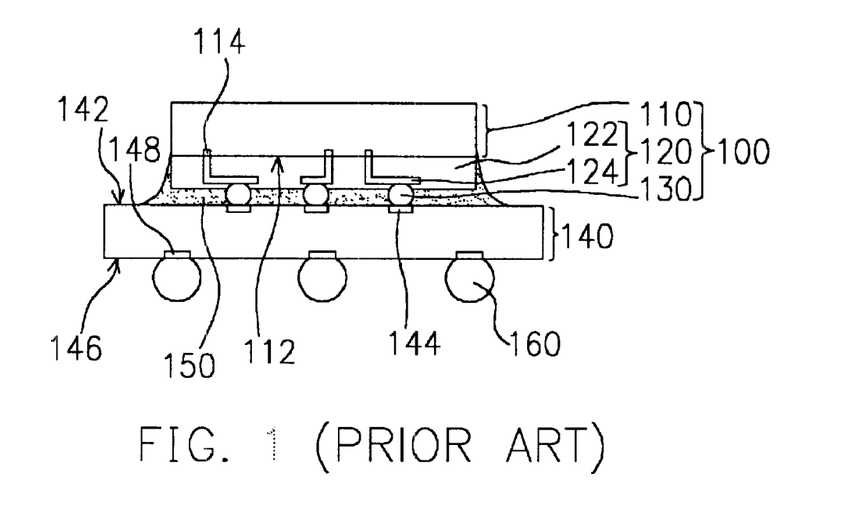
FIG. 1 is a schematic cross-sectional side view of a conventional wafer level flip-chip package structure.

To produce a wafer level package, a wafer comprising a plurality of chips with scribe lines cutting across the area between neighboring chips is provided. Thereafter, a redistribution layer is formed over the active surface of the wafer. Bumps are formed at various locations over the redistribution layer. Finally, the wafer is cut up into individual chips. The cutting process also cuts up the redistribution layer structures between neighboring chips to form independent flip chip packages such as the one shown in FIG. 1. FIG. 1 is a schematic cross-sectional side view of a conventional wafer level flip-chip package structure. As shown in FIG. 1, each flip-chip package 100 includes a silicon chip 110, a redistribution layer structure 120 and a plurality of bumps 130. The silicon chip 110 has a multiple of bonding pads 114 on the active surface 112 of the chip 110. The redistribution layer structure 120 is a layer formed over the active surface 112 of the chip 110. The redistribution layer 120 comprises an insulation layer 122 and a plurality of metallic circuit lines 124. The metallic circuit lines 124 criss-cross each other within the insulation layer 122 and connect electrically with the bonding pads 114. The bumps 130 are electrically connected to various metallic lines 124 at various locations above the redistribution circuit layer 120.

In general, a flip-chip package 100 is mounted to a substrate board 140. The substrate board 140 has a plurality of bump pads 144 and a plurality of solder ball pads 148. The bump pads 144 are located on the upper surface 142 of the substrate board 140 while the solder ball pads 148 are located on the lower surface 146 of the substrate board 140. A solder reflow process may be conducted by sprinkling a reflux agent (not shown) over the substrate board 140 and heating to join the bumps 130 on the flip-chip package 100 with the bump pads 144 on the substrate board 140.

Thereafter, filler material 150 is deposited into the space between the flip-chip package 100 and the substrate board 140 so that the bumps 130 are entirely enclosed. A plurality of solder balls 160 is mounted to the solder ball pads 148 on the substrate board 140. Through the solder balls 160, the substrate board 140 may connect electrically with a printed circuit board (not shown).

Since the silicon chip 110 and the substrate board 140 are made from different materials and hence each has different thermal expansion coefficient, filler material 150 must be inserted into the space between the chip 110 and the substrate 140 to prevent thermal stress resulting from heat cycles. Repeated thermal stress may lead to the breakup of bumps 130. However, because the gap between the chip 110 and the substrate 140 is very small, the filler material 150 is actually passed into the space slowly through capillary effect. Hence, the fill-up process is not only time-consuming and costly, but the space between the flip-chip package 100 and the substrate 140 is very often not completely filled. Furthermore, one end of the bumps 130 joins up with the redistribution circuit layer 120 over the chip 110 while the opposite end of the bump 130 joins up with the bump pads 144 on the substrate 140. Thus, thermal stress between the chip 110 and the substrate 140 often leads to the production of a shear force that may break up the bump 130 in a lateral direction.

SUMMARY OF INVENTION

Accordingly, one object of the present invention is to provide a wafer level packaging structure and fabricating process capable of reducing production cost.

A second object of this invention is to provide a wafer level package structure and fabricating process capable of minimizing shear stress due to a difference in thermal expansion coefficient between the wafer and a substrate board.

To achieve these and other advantages and in accordance with the purpose of the invention, as embodied and broadly described herein, the invention provides a chip structure. The chip structure includes a wafer, an insulation layer, conductive paste, a plurality of ball pads, a solder mask and a plurality of solder balls. The chip has an active surface and the insulation layer is applied over the active surface of the chip.

The insulation layer has a plurality of open windows. The conductive paste fills the open windows. The ball pads are formed over the insulation layer in electrical contact with the conductive paste. The solder mask covers the insulation layer but exposes the ball pads. The solder balls are mounted to the ball pads.

According to one preferred embodiment of this invention, a redistribution circuit layer may form in the space between the insulation layer and the chip. The redistribution circuit layer includes an insulation layer and a plurality of metallic circuit lines. The metallic circuit lines crisscross each other inside the insulation layer. The metallic circuit lines are electrically connected to the conductive paste and the chip. In addition, a bump may be inserted into the open windows so that the conductive paste is in electrical contact with the bump.

This invention also provides a method of forming a wafer level package. First, a silicon wafer is provided. The wafer has an active surface. An insulation layer is formed over the active surface of the wafer. A plurality of open windows is formed in the insulation layer. Conductive paste is passed into the open windows. A metallic layer is formed over the insulation layer. The metallic layer is patterned to form a plurality of ball pads that connect electrically with the conductive paste. A solder mask that exposes the ball pads is formed over the insulation layer. Solder balls are implanted on the exposed ball pads. Finally, the wafer together with the insulation layer is diced up to form independent chip packages.

One preferred embodiment of this invention, before forming the insulation layer over the active surface of the wafer, further includes forming a redistribution circuit layer over the active surface of the wafer. The insulation layer is next formed the redistribution circuit layer. The wafer further includes a plurality of bumps on the active surface positioned inside the opening of the insulation layer.

In the wafer level package structure, since the bumps are surrounded by conductive paste, the bump and corresponding solder ball are electrically connected together through the conductive paste. Because the conductive paste has good extensibility, shear stress on the bumps due to thermal stress between the wafer and a printed circuit board is minimized. The diced up package occupies a relatively small space. In fact, the sectional area of the package is almost identical to the chip. Furthermore, all bumps are formed inside the open windows of the insulation layer. Hence, overall thickness of the individual package is reduced. In addition, according to the wafer level package manufacturing process of this invention, the chip and the substrate are fabricated separately and subsequently integrated together. This arrangement lowers the production cost of each package considerably.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Reference will now be made in detail to the present preferred embodiments of the invention, examples of which are illustrated in the accompanying drawings. Wherever possible, the same reference numbers are used in the drawings and the description to refer to the same or like parts.

Figure 2:
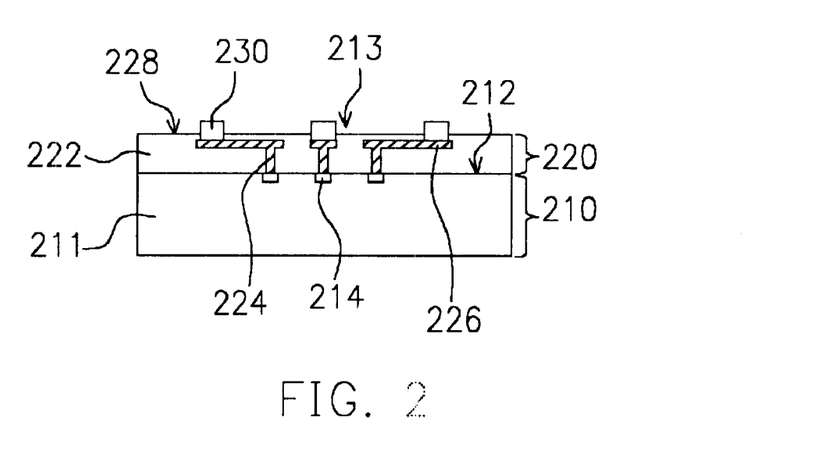
FIGS. 2 to 9 are schematic cross-sectional views showing the progression of steps for producing a wafer level package according to a first preferred embodiment of this invention.

FIGS. 2 to 9 are schematic cross-sectional views showing the progression of steps for producing a wafer level package according to a first preferred embodiment of this invention. First, as shown in FIG. 2, a silicon wafer 210 comprising of a plurality of chips 211 is provided (only a single chip is shown in FIG. 2). The wafer 210 has an active surface 212. A plurality of bonding pads 214 is formed on the active surface 212 of the wafer 210. The patterned wafer 210 also includes an active side 213. The semiconductor device (not shown) and bonding pads 214 of the wafer 210 are located on the active side 213.

A redistribution circuit structure 220 is formed over the active surface 212 (that is, on the active side 213 of the wafer 210). The redistribution circuit structure 220 has an insulation layer 222, a plurality of metallic circuit lines 224 and a plurality of contact points 226. The contact points 226 are exposed through the upper surface 228 of the redistribution circuit structure 220. The metallic circuit lines 224 crisscross inside the insulation layer 222. Bonding pads on the wafer 210 and the contact points 226 are electrically connected through the metallic circuit lines 224. A plurality of bumps 230 is formed over the contact points 226 by net printing or photolithographic plating. The bumps 230 are made from a material such as tin-silver-copper alloy, tin-bismuth alloy, tin-lead alloy, nickel gold alloy or gold.

Figure 3:
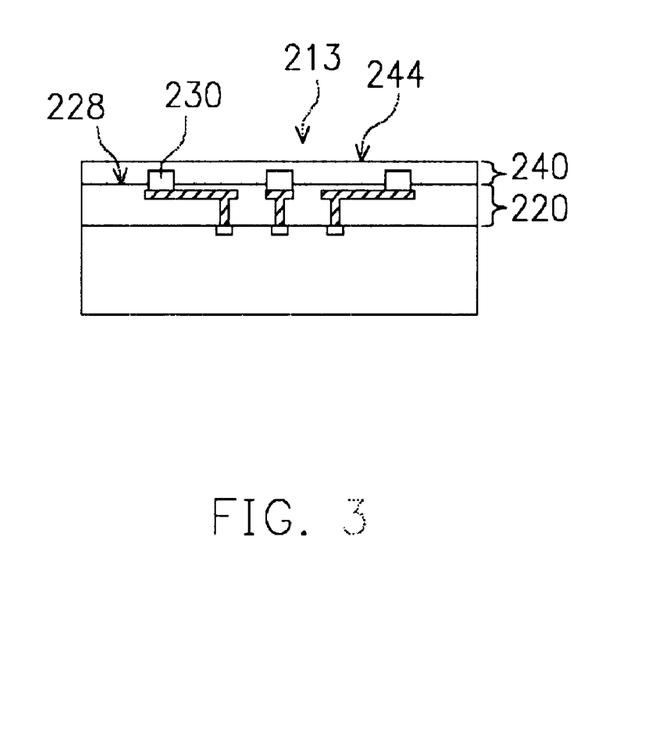

As shown in FIG. 3, an insulation layer 240 is formed over the upper surface 228 (the active side 213 of the wafer 210) of the redistribution circuit structure 220 by laminating or spin-coating. The insulation layer 240 encloses all the bumps 230 and has an exposed upper surface 244. The insulation layer 240 is made from a high molecular weight polymer such as epoxy resin, polyimide (PI).

Figure 4:
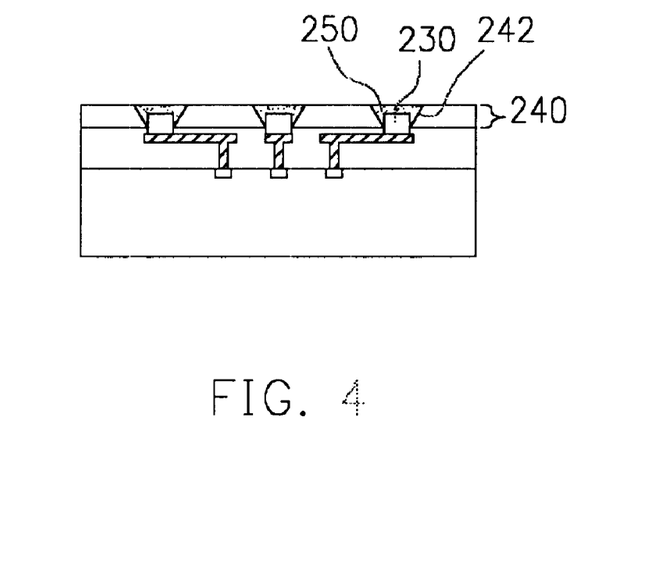

As shown in FIG. 4, a plurality of open windows 242 are formed in the insulation layer 240 either by performing photolithographic and etching processes or laser drilling. The open windows are formed where the bumps 230 are located. The open windows 242 pass through the insulation layer 240 and expose the bumps 230. Conductive paste 250 is applied to the open windows 242 of the insulation layer 240 so that the conductive paste 250 is electrically connected to the bumps 230. The conductive paste 250 can be a silver or copper containing resin, for example.

Figure 5:
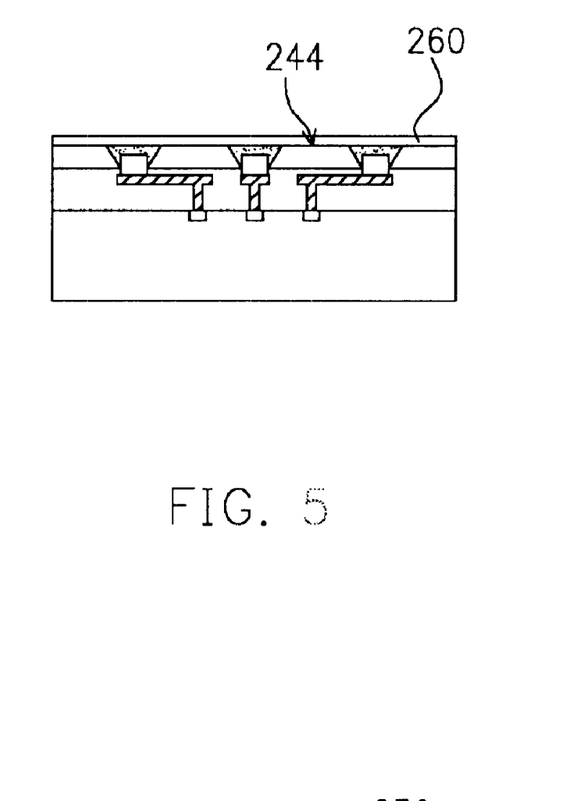

As shown in FIG. 5, a metallic layer 260 is formed over the insulation layer 240 by laminating, sputtering or electroplating. The metallic layer 260 can be a copper layer, for example.

Figure 6:
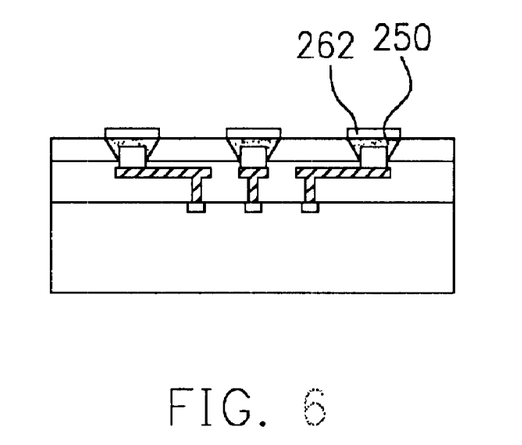

As shown in FIG. 6, the metallic layer 260 is patterned to form a plurality of ball pads 262 over the conductive paste 250 by conducting photolithographic and etching processes.

Figure 7:
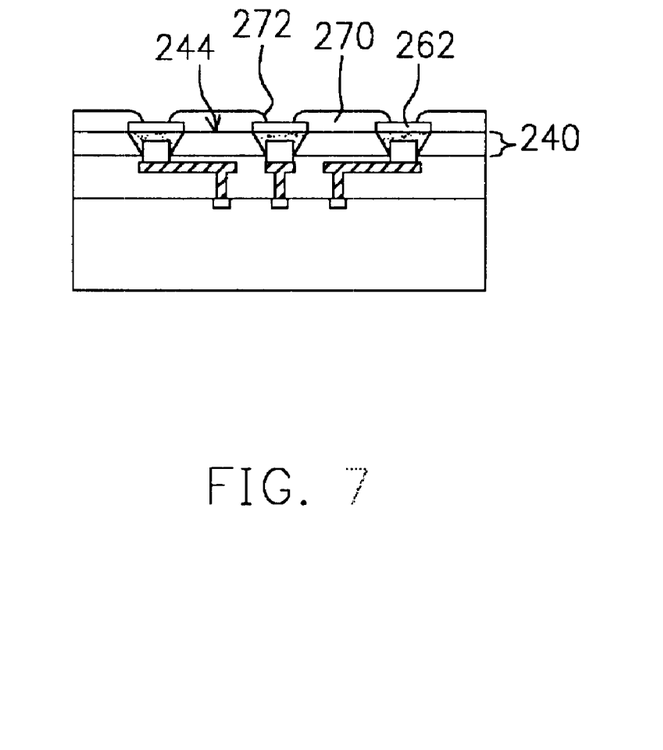

As shown in FIG. 7, a solder mask 270 is formed over the insulation layer 240 by net printing. The solder mask 270 has a plurality of open windows 272 that expose the ball pads 262.

Figure 8:
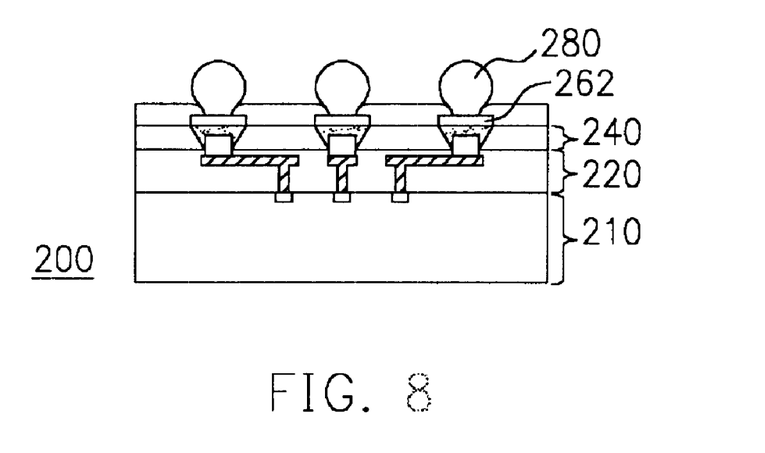
Figure 9:
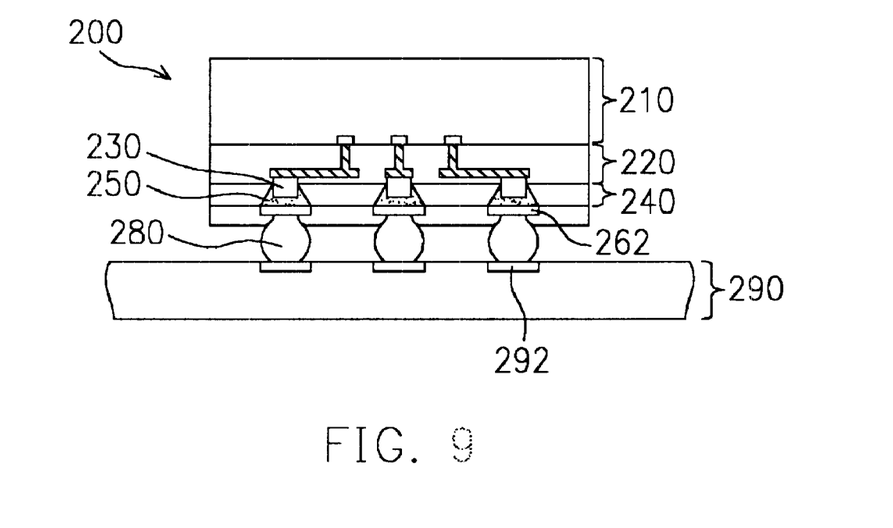

As shown in FIG. 8, a plurality of solder balls 280 are mounted onto the respective ball pads 262. Finally, the wafer 210, the redistribution circuit structure 220 and the insulation layer 240 are diced up to form a plurality of independent packages 200. Each independent package 200 may further be mounted to the contact pads 292 on a printed circuit board 290 via the solder balls 280 so that a structure as shown in FIG. 9 is formed.

In the aforementioned wafer level package structure, since the conductive paste 250 surrounds the bumps 230 and is in contact with the ball pads 262, the bumps and the solder balls 280 are electrically connected together. Because the conductive paste 250 has fairly good extensibility, deformation between the chip 210 and the printed circuit board 290 caused by differential thermal expansion has little effect on the bumps 230. Hence, bump breakage due to shear stress in a conventional design is avoided.

The cutout package 200 occupies a relatively small volume and the sectional area of the package 200 is almost identical to the sectional area of the chip 210. In addition, the bumps 230 are enclosed within the open windows 242 of the insulation layer 240. Hence, overall thickness of the package 200 is also reduced. Furthermore, the chip and the substrate of the wafer level package structure are separately fabricated before being put together. Thus, production cost is further lowered.

According to current technological limits, the smallest distance for joining solder balls onto a printed circuit board is between 300 µm to 500 µm. However, minimum distance of separation between bonding pads can be as small as 50 µm. Consequently, a redistribution layer is required to redistribute the contact points so that the printed circuit board has sufficient space for mounting necessary solder balls. The redistribution circuit structure, aside from the one described in the aforementioned first embodiment, may include others as follows.

Figure 10:
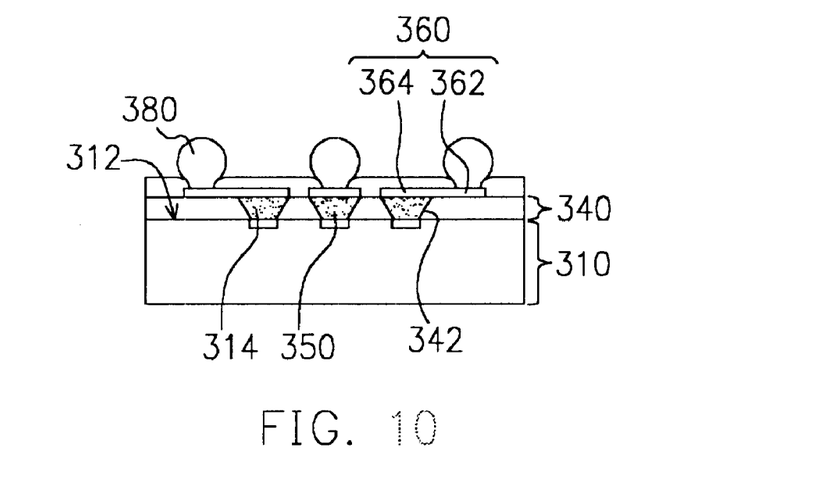
FIG. 10 is a schematic cross-sectional view showing a wafer level package structure according to a second preferred embodiment of this invention.
Figure 11:
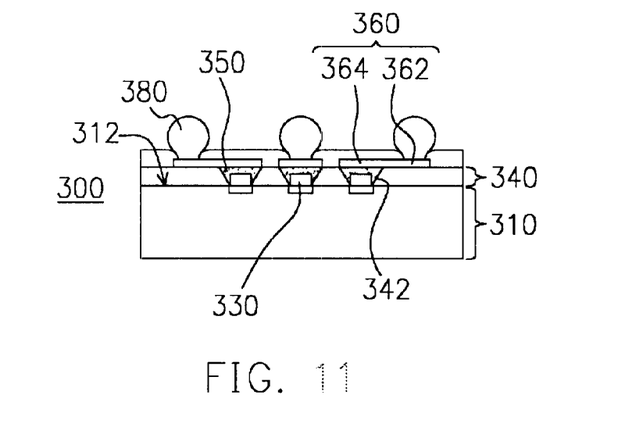
FIG. 11 is a schematic cross-sectional view showing a wafer level package structure according to a third preferred embodiment of this invention.

FIG. 10 is a schematic cross-sectional view showing a wafer level package structure according to a second preferred embodiment of this invention. As shown in FIG. 10, the insulation layer 340 is directly formed over the active surface 312 of the wafer 310. Open windows in the insulation layer 340 expose the bonding pads 314. Through photolithographic and etching processes, the metallic layer 360 is patterned into a plurality of circuits 364 and a plurality of ball pads 362. The ball pads are redistributed to suitable locations for bonding solder balls 380. Furthermore, each opening 342 in the insulation layer 340 may be designed to be free of bumps so that the opening 342 is entirely filled by the conductive paste 350. Since bumps are not required, steps for fabricating bumps can be eliminated to reduce production cost. FIG. 11 is a schematic cross-sectional view showing a wafer level package structure according to a third preferred embodiment of this invention. In FIG. 11, bumps 330 are produced inside the open windows 342 of the insulation layer 340. Because the bumps 330 are made of metal, electrical conductivity is greater than the conductive paste 350. Hence, the addition of bumps has the advantage of increasing overall conductivity of the package 300. Since the package has all the other components identical to the second embodiment, detailed description is omitted.

Figure 12:
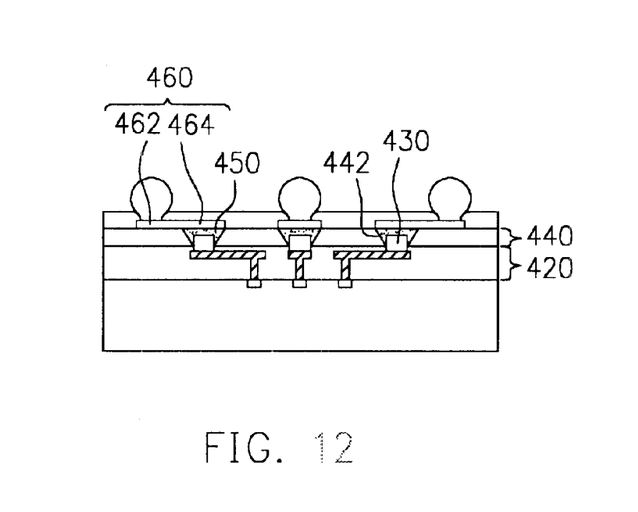
FIG. 12 is a schematic cross-sectional view showing a wafer level package structure according to a fourth preferred embodiment of this invention.

FIG. 12 is a schematic cross-sectional view showing a wafer level package structure according to a fourth preferred embodiment of this invention. When an upstream manufacturer fabricates a redistribution circuit structure 420, locations of bumps 430 may not correspond with the contact points of a printed circuit board (not shown). Circuit redistribution may be carried out during the fabrication of the metallic layer 460 so that ball pads 462 and contact points on the printed circuit board match. The ball pads 462 and conductive paste 450 are electrically connected together through the circuit lines 464. Furthermore, each opening 442 in the insulation layer 440 may be designed to be free of bumps so that the opening 442 is entirely filled by the conductive paste 450.

Figure 13:
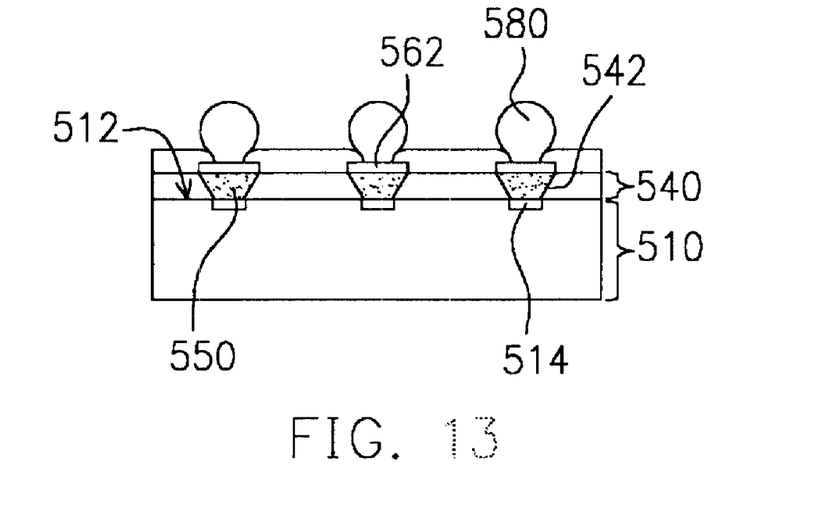
FIG. 13 is a schematic cross-sectional view showing a wafer level package structure according to a fifth preferred embodiment of this invention.

In all the aforementioned embodiments, circuit redistribution is carried out using either a redistribution circuit structure or a metallic layer so that all ball pads match the position of contact points on a printed circuit board while enough space is reserved between neighboring ball pads for mounting solder balls. However, the scope of application for this invention is not limited as such. In fact, the bonding pads on a chip may be designed in such a way that the locations of all the bonding pads match the contact points on a printed circuit board (not shown) exactly. FIG. 13 is a schematic cross-sectional view showing a wafer level package structure according to a fifth preferred embodiment of this invention. Since the bonding pads 514 are located in positions that correspond to the contact points on a printed circuit board, there is no need to fabricate a redistribution circuit structure on the active surface 512 of the chip 510. The ball pads 562 are formed inside the open windows 542 of the insulation layer 540 above the conductive paste 550 and the solder balls 580 are mounted to the bonding pads 514. In addition, a bump may form inside the opening 542 of the insulation layer 540 to increase electrical conductivity of the package.

Hence, it does not matter whether an upstream manufacturer has fabricated bumps on the chip package or not, the wafer level packaging method of this invention can be applied so that the chip package can mount directly to a printed circuit board through solder balls. Moreover, according to this invention, the open windows within the insulation layer may or may not contain bumps. In addition, aside from the aforementioned applications, the idea of putting conductive paste into the open windows of an insulation layer can have other applications such as in the fabrication of a substrate board.

In conclusion, the invention at least has the following advantages:

1. Since each bump is surrounded by conductive paste, electric current is able to pass from the bump to the solder ball via the conductive paste. Because conductive paste has good extensibility, thermal stress caused by deformation between the chip and the circuit board caused by heat is annulled. Hence, contact failure due to bump breakage in a conventional package design is entirely avoided.

2. The final cutout package has a relatively small volume, and the sectional area of the package is almost identical to the sectional area of the chip. Moreover, the bumps are enclosed inside the open windows of the insulation layer so that overall thickness of the package is reduced.

3. The wafer level package structure and manufacturing procedure can reduce the production cost.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A wafer level packaging process, comprising the steps of:

providing a wafer having a plurality of chips thereon, wherein the wafer has an active side;

forming an insulation layer over the active side of the wafer, wherein the insulation layer exposes a surface;

forming a plurality of open windows in the insulation layer, wherein each open windows passes through the insulation layer;

forming a plurality of conductive paste plugs, wherein each of the conductive paste plugs is in the respective open window;

forming a metallic layer over the insulation layer;

patterning the metallic layer to form a plurality of ball pads electrically connected with the conductive paste;

forming a solder mask over the insulation layer surface to expose the ball pads;

mounting a plurality of solder balls, wherein each of the solder balls is attached to the respective ball pad; and dicing up the silicon wafer and the insulation layer to form a plurality of chip packages.

2. The wafer level packaging process of claim 1, wherein the step of forming the insulation layer on the active side of the wafer includes spin-coating.

3. The wafer level packaging process of claim 1, wherein the step of forming the insulation layer on the active side of the wafer includes laminating.

4. The wafer level packaging process of claim 1, wherein the step of forming open windows in the insulating layer includes conducting photolithographic and etching processes.

5. The wafer level packaging process of claim 1, wherein the step of forming open windows in the insulating layer includes laser drilling.

6. The wafer level packaging process of claim 1, wherein the step of patterning the metallic layer to form the ball pads includes conducting photolithographic and etching processes.

7. The wafer level packaging process of claim 1, wherein the wafer further includes a plurality of bumps on the active side of the wafer, wherein each of the bumps is formed inside the respective open window of the insulation layer.

8. The wafer level packaging process of claim 1, wherein before the step of forming the insulation layer on the active side of the wafer, further includes forming a redistribution circuit layer on the active side of the wafer.

9. A process of forming an insulation layer having a plurality of conductive paste plugs therein over a wafer, comprising the steps of:

providing a wafer having a plurality of chips therein, wherein the wafer has an active side;

forming an insulation layer over the active side of the wafer;

forming a plurality of open windows in the insulation layer;

forming a plurality of conductive paste plugs, wherein each of the conductive paste plug is inside the respective open window; and forming a patterned metallic layer over the insulation layer in electrical connection with at least one conductive paste plug.

10. The process of claim 9, wherein the step of forming the insulation layer on the active side of the wafer includes spin-coating.

11. The process of claim 9, wherein the step of forming the insulation layer on the active side of the wafer includes laminating.

12. The process of claim 9, wherein the step of forming open windows in the insulation layer includes conducting photolithographic and etching processes.

13. The process of claim 9, wherein the step of forming open windows in the insulation layer includes laser drilling.

14. The process of claim 9, wherein the wafer further includes a plurality of bumps on the active side of the wafer, wherein each of the bumps is inside the respective open window of the insulation layer.

15. The process of claim 9, wherein before the step of forming the insulation layer on the active side of the wafer, further includes forming a redistribution circuit layer on the active side of the wafer.

16. The process of claim 9, wherein the patterned metallic layer forms at least a ball pad that is electrically connected to the conductive paste plug.

* * * * *